(12) United States Patent
Oberg

(10) Patent No.: US 6,661,356 B1
(45) Date of Patent: Dec. 9, 2003

(54) METHOD AND APPARATUS FOR DC-LEVEL CONSTRAINED CODING

(75) Inventor: Mats Oberg, Cupertino, CA (US)

(73) Assignee: Marvell International, Ltd., Hamilton (BM)

(*) Notice: Subject to any disclaimer, the term of this patent is extended or adjusted under 35 U.S.C. 154(b) by 0 days.

(21) Appl. No.: 10/053,885

(22) Filed: Jan. 16, 2002

Related U.S. Application Data

(60) Provisional application No. 60/273,357, filed on Mar. 5, 2001.

(51) Int. Cl.[7] .................................................. H03M 7/00
(52) U.S. Cl. ........................................... 341/58; 341/59
(58) Field of Search ....................................... 341/58, 59

(56) References Cited

U.S. PATENT DOCUMENTS

| | | |
|---|---|---|
| 4,675,650 A | 6/1987 | Coppersmith et al. |
| 4,888,779 A | 12/1989 | Karabed et al. |
| 5,144,304 A | 9/1992 | McMahon et al. |
| 5,396,239 A | 3/1995 | McMahon et al. |
| 5,537,424 A | 7/1996 | Karabed et al. |
| 5,608,397 A | 3/1997 | Solkanin |
| 5,636,933 A | 6/1997 | Fitzpatrick et al. |
| 5,757,822 A | 5/1998 | Fisher et al. |
| 5,910,696 A | 6/1999 | Sayiner et al. |
| 6,018,304 A | 1/2000 | Bessios |
| 6,046,691 A | 4/2000 | Aziz et al. |
| 6,097,320 A | 8/2000 | Kuki et al. |
| 6,184,806 B1 | 2/2001 | Patapoutian et al. |
| 6,198,413 B1 * | 3/2001 | Widmer .................. 341/59 |
| 6,204,781 B1 * | 3/2001 | Aziz et al. ............... 341/59 |
| 6,366,223 B1 * | 4/2002 | Lee et al. ................ 341/51 |

FOREIGN PATENT DOCUMENTS

| | | |
|---|---|---|
| US | EP1058432 A2 | 6/2000 |

OTHER PUBLICATIONS

Nan–Hsiung Yeh, "Equivalence of Signal Processing in Perpendicular and Longitudinal Recordings" Digests of PMRC 2000, The Fifth Perpendicular Magnetic Recording Conference, (Sendai, Japan) Oct. 23–26, 2000, p. 231.

* cited by examiner

*Primary Examiner*—Howard L. Williams

(57) ABSTRACT

A method and apparatus reduces a DC level of an input word. The input word is divided into a plurality of components that include n symbols. The n symbols of the components are summed for each component. The component is encoded into a substitute component if a sum for the component exceeds a threshold. The components having a sum that does exceed the threshold are combined with at least one substitute component into an output word. An output word template is selected based on a number of substitute components and on a position that the substitute components originally occupied in the input word. The substitute components are inserted in the output word template. The components that have a sum that does not exceed the threshold are inserted in the output word template. Address and indicator symbols are inserted in the output word.

255 Claims, 9 Drawing Sheets

| # bad bytes | # avail symbols | # combi- nations | # symbols to address | # indicator symbols | Indicators |
|---|---|---|---|---|---|
| 1 | 3 | 4 | 2 | 1 | 1 |
| 2 | 6 | 6 | 3 | 3 | -1,1,-1 |
| 3 | 9 | 4 | 2 | 7 | -1,1,1,x,...,x |
| 4 | 12 | 1 | 0 | 12 | -1,-1,1,x,...,x |

| "Bad Code Words" | Indicator | Address | Code Word |
|---|---|---|---|
| - | - | - | {A,B,-1,C,D} |
| A | 1 | -1,-1 | {B,1,-1,-1,Enc(A),1,C,D} |
| B | 1 | -1,1 | {A,1,-1,1,Enc(B),1,C,D} |
| C | 1 | 1,-1 | {A,1,-1,-1,Enc(C),1,B,D} |
| D | 1 | 1,1 | {A,1,-1,-1,Enc(D),1,B,C} |
| A,B | -1,1 | 1,-1,-1 | {C,-1,1,-1,Enc(A),1,1,-1,-1,Enc(B),D} |
| A,C | -1,1 | -1,1,-1 | {B,-1,1,-1,Enc(A),1,-1,-1,-1,Enc(C),D} |
| A,D | -1,1 | -1,-1,1 | {B,1,1,-1,Enc(A),1,-1,-1,-1,Enc(D),C} |
| B,C | -1,1 | 1,1,-1 | {A,-1,1,-1,Enc(B),1,1,1,-1,Enc(C),D} |
| B,D | -1,1 | 1,-1,1 | {A,-1,1,-1,Enc(B),1,1,-1,1,Enc(D),C} |
| C,D | -1,1 | -1,1,1 | {A,-1,1,-1,Enc(C),1,-1,1,1,Enc(D),B} |
| A,B,C | -1,1,1,-1 (3) | 1,1 | {Enc(A),-x,1,1,-1,-1,1,1,Enc(B),1,-1,-x,x,Enc(C),D} |
| A,B,D | -1,1,1,-1 (3) | 1,-1 | {Enc(A),-x,1,-1,-1,-1,1,1,Enc(B),1,-1,-x,x,Enc(D),C} |
| A,C,D | -1,1,1,-1 (3) | -1,1 | {Enc(A),-x,-1,1,-1,1,1,1,Enc(C),1,-1,-x,x,Enc(D),B} |
| B,C,D | -1,1,1,-1 (3) | -1,-1 | {Enc(B),-1,-1,-1,-1,1,1,Enc(C),1,-1,-x,x,Enc(D),A} |
| A,B,C,D | -1,1,1,1 (8) | - | {Enc(A),1,-1,-1,-1,1,1,Enc(B),1,1,-x,x,Enc(C),Enc(D),x,x,x} |

FIG. 6

| Input Byte | Output Word |
|---|---|
| 1,1,1,1,1,1,1,-1 | 1,-1,1,-1,1 |
| 1,1,1,1,1,1,-1,1 | 1,-1,1,1,-1 |
| 1,1,1,1,-1,1,1 | -1,1,1,1,-1 |
| 1,1,1,-1,-1,1,1,1 | 1,1,1,-1,-1 |
| 1,1,1,-1,-1,1,1,1 | 1,1,-1,1,-1 |
| 1,1,-1,1,1,1,1,1 | 1,1,-1,-1,1 |
| 1,-1,1,1,1,1,1,1 | -1,1,1,1,-1 |
| -1,1,1,1,1,1,1,1 | -1,1,-1,-1,1 |
| 1,1,1,1,1,1,1,1 | -1,1,-1,1,1 |
| 1,-1,1,-1,-1,1,1,-1 | 1,-1,1,1,1 |

FIG. 7

METHOD AND APPARATUS FOR DC-LEVEL CONSTRAINED CODING

CROSS-REFERENCE TO RELATED APPLICATIONS

This application claims the benefit of U.S. Provisional Application No. 60/273,357, filed Mar. 5, 2001, which is hereby incorporated by reference.

FIELD OF THE INVENTION

The present invention relates to encoders and decoders, and more particularly to DC-level constrained coding and decoding.

BACKGROUND OF THE INVENTION

In magnetic recording media, such as hard disks for computers, a transducer is positioned adjacent to a magnetic recording media. In longitudinal recording, the transducer records data by magnetizing the magnetic recording media in a longitudinal direction. In other words, the transducer magnetizes parallel to the direction of relative movement between the magnetic medium and the transducer. In perpendicular recording, the transducer records data by magnetizing the magnetic recording media in a perpendicular direction.

Computers manipulate information using binary symbols that include the alphabet {1,0}. When writing to the magnetic media, computers magnetize the magnetic media in opposite magnetic directions. To more accurately reflect the bipolar physical magnetization, the information signals are represented by the alphabet {1,-1}.

Each bit storage location on a disk drive is a magnetic domain that includes a number of grains, which are crystals of magnetic material. Perpendicular recording allows a smaller grain size than longitudinal recording before encountering a superparamagnetic effect. Perpendicular recording allows tracks that are more narrow and well defined than those in longitudinal recording. In other words, perpendicular recording allows significantly higher areal densities.

The write signals in longitudinal and perpendicular recording are also different. Referring now to FIG. 1, a write signal 10 in longitudinal recording is normally at a DC null 12. The write signal 10 transitions from the DC null 12 to +a or −a during a transition 14 and returns to the DC null 12 until a subsequent transition occurs. In perpendicular recording, however, a write signal 16 transitions between +a or −a. In other words, the write signal 16 does not return to the DC null 12.

In perpendicular recording, a preamplifier and input AC coupling introduces DC distortion. The distortion is monitored and compensation is provided. As the number of consecutive a's or −a's increases, a DC offset of the perpendicular recorder tends to drift. In addition, the number of alternating transitions between adjacent symbols should be limited to the extent possible.

SUMMARY OF THE INVENTION

A method and apparatus according to the present invention constrains a DC level of an input word. The input word is divided into a plurality of components that include n symbols. The n symbols are summed for each component. An absolute value of the sum is compared to a threshold. The component is encoded into a substitute component if the absolute value of the sum for the component exceeds the threshold. The components having the absolute value that does not exceed the threshold are combined with at least one substitute component into an output word.

In other features of the invention, the substitute component includes less than n symbols. The input word includes 32 symbols and the output word includes at least 33 symbols. The components include 8 symbols and the substitute component includes 5 symbols.

In still other features, an output word template is selected based on a number of substitute components and based upon a position that the substitute components originally occupied in the input word. The substitute components are inserted in the output word based on the output word template. The components that have the absolute value that does not exceed the threshold are inserted in the output word based on the output word template. Address and indicator symbols are inserted in the output word.

In other features, a parity symbol is added to the output word to make a product of symbols of the output word positive or negative.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 6 is a table for mapping output words for various bad components;

FIG. 7 is a table for mapping bad components to shorter substitute components;

DETAILED DESCRIPTION OF THE PREFERRED EMBODIMENTS

The following description of the preferred embodiment(s) is merely exemplary in nature and is in no way intended to limit the invention, its application, or uses.

Figure 2:
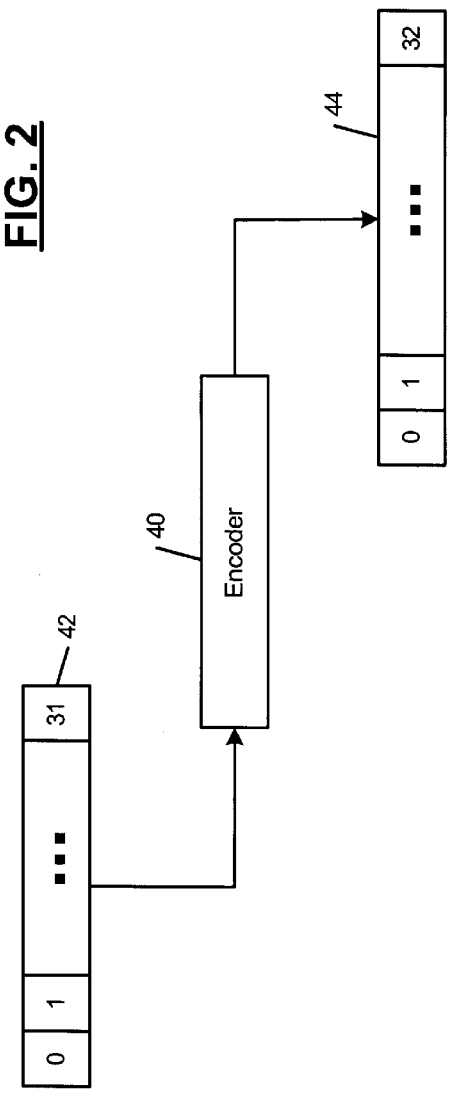
FIG. 2 is a block diagram illustrating a DC-constrained encoder according to the present invention.

Referring now to FIG. 2, a DC-level constrained encoder 40 maps an encoder input word 42 into an encoder output word 44. The output word 44 contains one or more additional symbols than the input word 42. The present invention will be described with the input word 42 having 32 symbols. The present invention will also be described with the output word 44 having 33 or 34 symbols. Skilled artisans will appreciate that the present invention has application to input words and output words having other lengths and other differential lengths.

The output word 44 contains 33 symbols that are selected from an alphabet defined by A={−1, 1}. The output word 44 has at most 13 consecutive symbols that are the same. Any set of 33 consecutive symbols has a digital sum between −21 and 21. The digital sum over the output word 44 is between −17 and 17. As can be appreciated, the DC-level constrained encoder 40 of the present invention constrains the DC level of the output word 44. The longest run of continuous transitions is 22. A parity symbol can optionally be added to the output word 44 as will be described more fully below.

Figure 3:
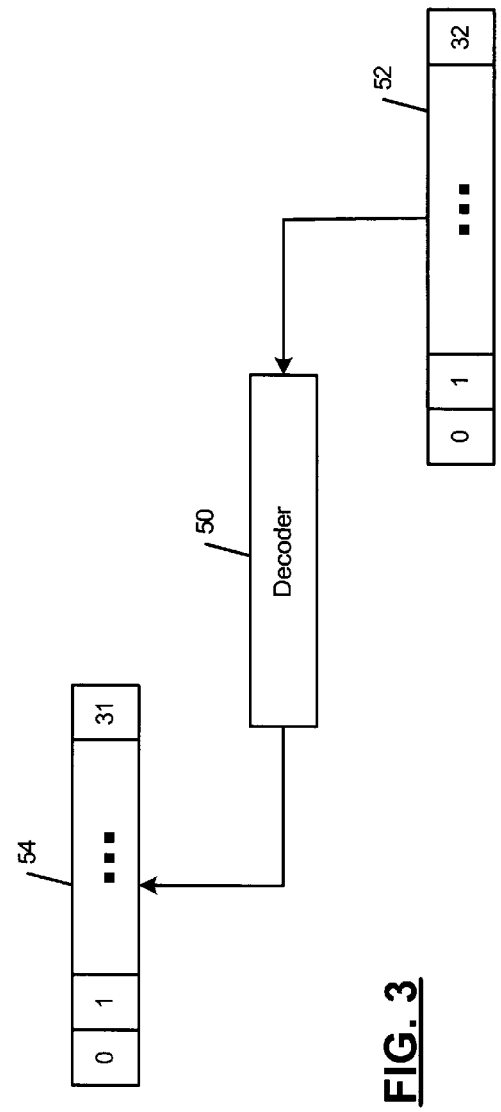
FIG. 3 is a block diagram illustrating a decoder according to the present invention.
Figure 4:
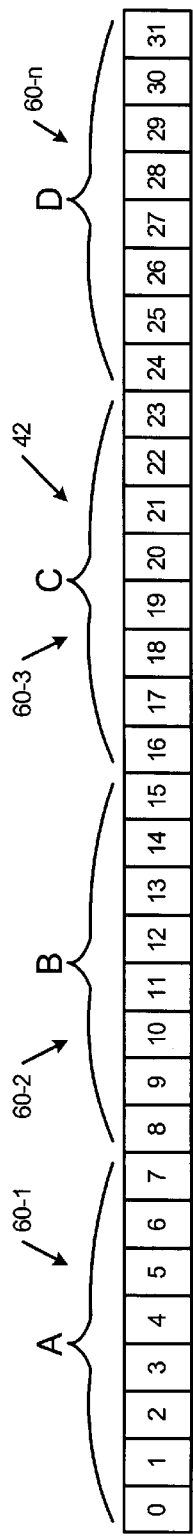
FIG. 4 illustrates a word that is divided into components that include multiple symbols.

Referring now to FIG. 3, a decoder 50 reverses the operation of the encoder 40. In other words, the decoder 50 maps encoded output word 52 into a decoded input word 54. Referring now to FIG. 4, the input word 42 is divided into a plurality of components that are labeled A, B, C, and D. Each component includes multiple symbols. In the exemplary embodiment, the input word 42 includes 32 symbols. The input word 42 is divided into four components that are labeled A, B, C, and D. In other words, A includes $\{u_0, u_1, \ldots, u_7\}$, B includes $\{u_8, u_9, \ldots, u_{15}\}$, C includes $\{u_{16}, u_{17}, \ldots, u_{23}\}$, and D includes $\{u_{24}, u_{17}, \ldots, u_{31}\}$.

A component digital sum is the sum of the individual symbols in the component. For example, if A={1,1,1,1,1,1,1,1}, the component digital sum of A is equal to 8. The encoder 40 classifies the components as good or bad. If a component is a good component, the component is inserted without modification into the output word 44. If a component is a bad component, the component is encoded into a shorter substitute component and inserted into the output word 44. For example, an 8-symbol component that is bad is encoded into a 5-symbol substitute component.

When each component includes a byte, the component is considered to be bad if it has a component digital sum with an absolute value that is greater than a threshold such as 4. With this threshold, any component that includes more than six 1's or six −1's is automatically a bad component. Additional types of components may also be defined as being bad components to alleviate other problems such as an extended number of symbols with alternating signs. In other words, components having an alternating sign every other symbol are considered bad components. Based on the above example, there are 20 combinations that are bad components. The remaining 236 combinations are good components.

Figures 1, 5:
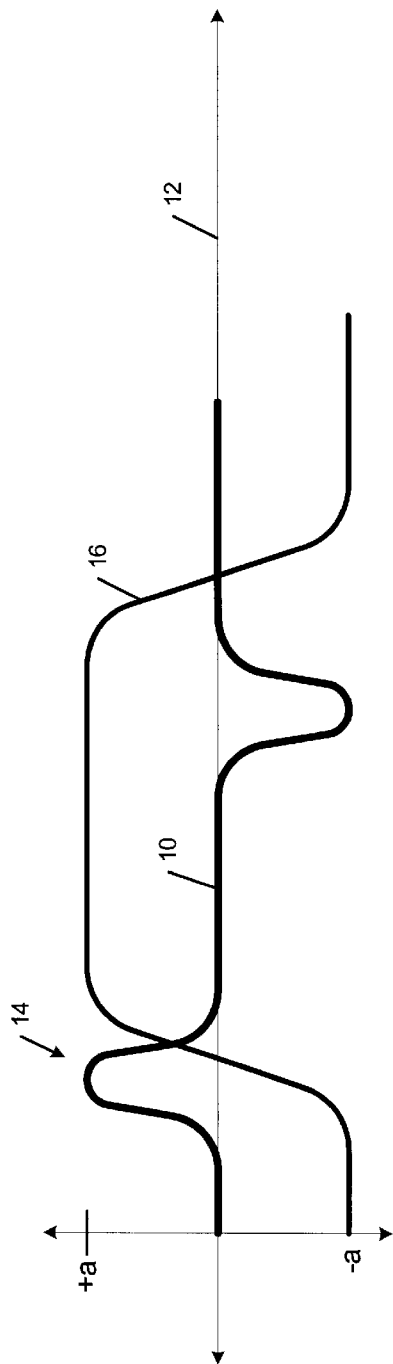
FIG. 1 is a graph illustrating write signals for longitudinal and perpendicular recording on magnetic media according to the prior art.
FIG. 5 is a table illustrating exemplary indicators for different numbers of bad components.

Referring now to FIG. 5 and continuing with the example, for a given 32 symbol input word 42, there can be 0, 1, 2, 3 or 4 bad components. A good component is inserted "as is" into the output word 44 and bad components are encoded into shorter substitute components having 5 symbols. Therefore, 32, 29, 26, 23 or 20 symbols are required to encode input words 42 with 0, 1, 2, 3 or 4 bad components, respectively. There are 1, 4, 7, 10, or 13 symbols, respectively, that can be used to indicate the combination of components that are encoded.

Referring now to FIG. 6, an example mapping of good and bad components to the output words 44 for an exemplary implementation of the DC-constrained encoder 40 is shown. The map defines one way to select address and indicator symbols based on the position and number of bad components in the input word 42. The map also shows one way to position the address and indicator symbols in the output word 44. The address symbols are used to identify the substitute components that are encoded. The indicator symbols are used to indicate the number of components that are encoded.

When there are 0 bad components in the input word 42, an indicator symbol is set equal to a first predetermined value and is placed in a particular symbol location in the output word 44. For example, the indicator symbol is set equal to −1 and is located in the center of the output word, e.g. $y_{16}=-1$. Other positions and values can be employed. If there are one or more bad components, the indicator symbol is set equal to a second predetermined value such as $y_{16}=1$. The indicator symbols defined by "x" can be selected freely. However, the "x" symbols should be selected to limit the DC level of the output word 44 and the total number of consecutive transitions in the output word 44.

To help the decoder 50 identify the good and substitute components of the encoded output word 44, one, two or three address symbols are employed. If one component of the input word 42 is bad, a two symbol address is used. If two components of the input word 42 are bad, a three symbol address is used. If three components are bad, a two symbol address is used to indicate the symbols that are not encoded. If four bytes are encoded, the addressing is redundant.

Referring now to FIG. 7, an encoder table for coding an 8-symbol bad component into the 5-symbol substitute component is shown. While the exemplary embodiment employs a lookup table, other mapping functions may be used. As can be appreciated, only bad components with positive values are included in the table. If the bad components have a negative component digital sum, the inverse of the encoder table is used. Alternately, the table can include components with negative component digital sums. If the component digital sum is equal to 0, then the sign is preferably decided by a first symbol in the argument although other default schemes may be used.

The decoder 50 initially checks the indicator symbol such as $y_{16}$. If $y_{16}$ is equal to the first predetermined symbol (such as −1), then none of the components are encoded. Otherwise, the decoder 50 checks the other indicator symbols and decodes the substitute components.

A single parity check symbol can optionally be added to the output word 44. For example, the addition of a parity symbol at the end of the output word 44 is used to make sure that the product of the symbols in the output word is positive. The addition of a parity bit at the end of each output word 44 gives a code, rate of 32/34. With this additional parity symbol, any set of 34 consecutive code symbols has a digital sum between −22 and 22. A running digital sum of the output word 44 is between −19 and 17. If the parity check symbol is added such that the product of the symbols and the output word is negative, the block digital sum is between −16 and 16.

Figure 8:
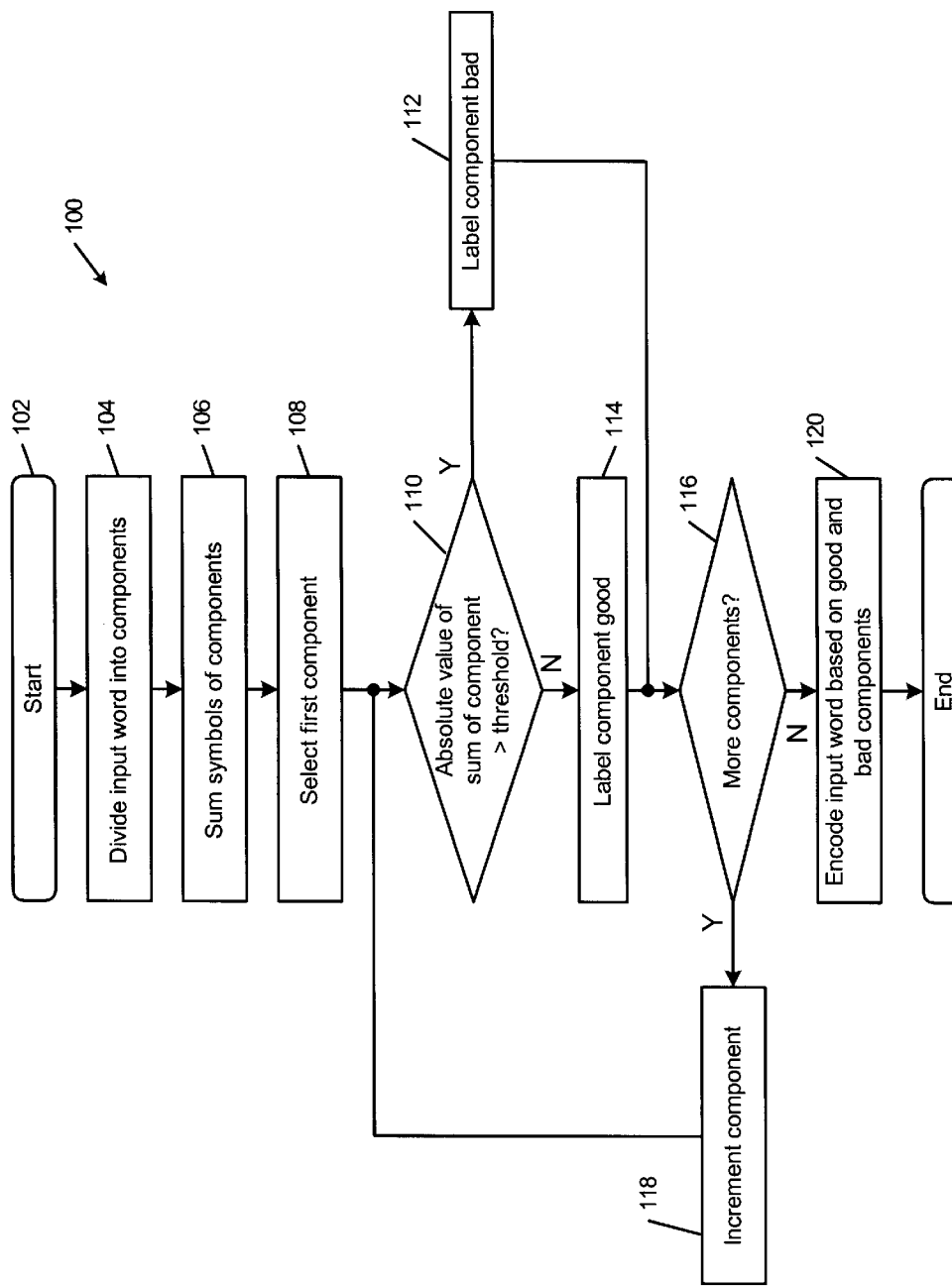
FIGS. 8 and 9 are flowcharts illustrating steps for encoding that are performed by the DC-constrained encoder of FIG. 2.

Referring now to FIG. 8, steps for encoding the input word 42 are shown generally at 100. In step 102, control begins. In step 104, the encoder 40 divides the input word 42 into a plurality of equal-length components. Each component includes n symbols. In step 106, the encoder 40 sums the symbols of each component. In step 108, the encoder 40 selects a first component. In step 110, the encoder 40 compares an absolute value of the sum of the symbols of the selected component to a threshold. If the absolute value of the sum is greater than the threshold, the encoder 40 designates the selected component bad in step 112. Otherwise, the encoder 40 labels the selected components good in step 114. In step 116, the encoder 40 determines whether there are any more components. If there are additional components in the input word 42, the encoder 40 increments the component and continues with step 110. Otherwise, the encoder 40 encodes the input word 42 based on the number and position of the good and bad components in step 120.

Figure 9:
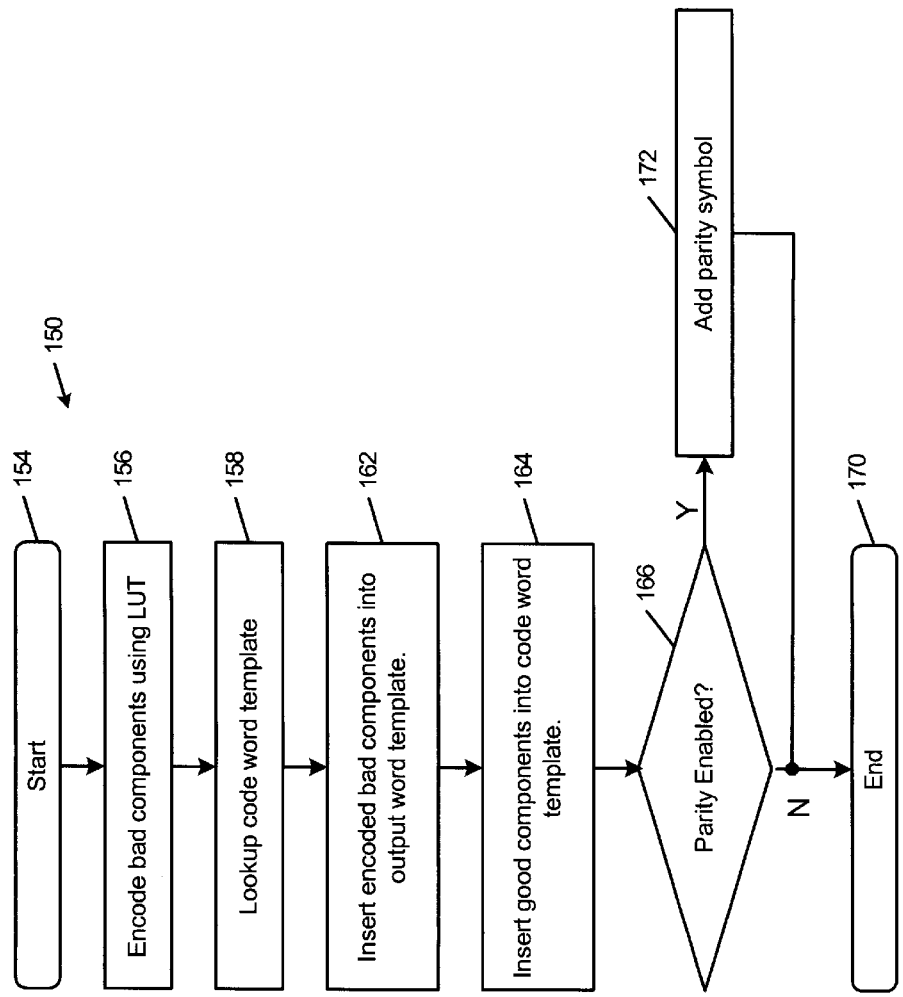

Referring now to FIG. 9, steps performed by the encoder 40 in step 120 are shown generally at 150. Control begins at step 154. In step 156, the encoder 40 generates substitute components for the bad components using a lookup table or other function. In step 158, the encoder 40 looks up a code or output word template based upon the number and position of the good and bad components in the input word 42. In step 162, the encoder 40 inserts substitute components into the output word template. In step 164, the encoder 40 inserts the good components into the output word template. In step 166, the encoder 40 determines whether a parity function is enabled. If not, control ends at step 170. Otherwise control continues with step 172 and a parity symbol is added as previously discussed above.

Figure 10:
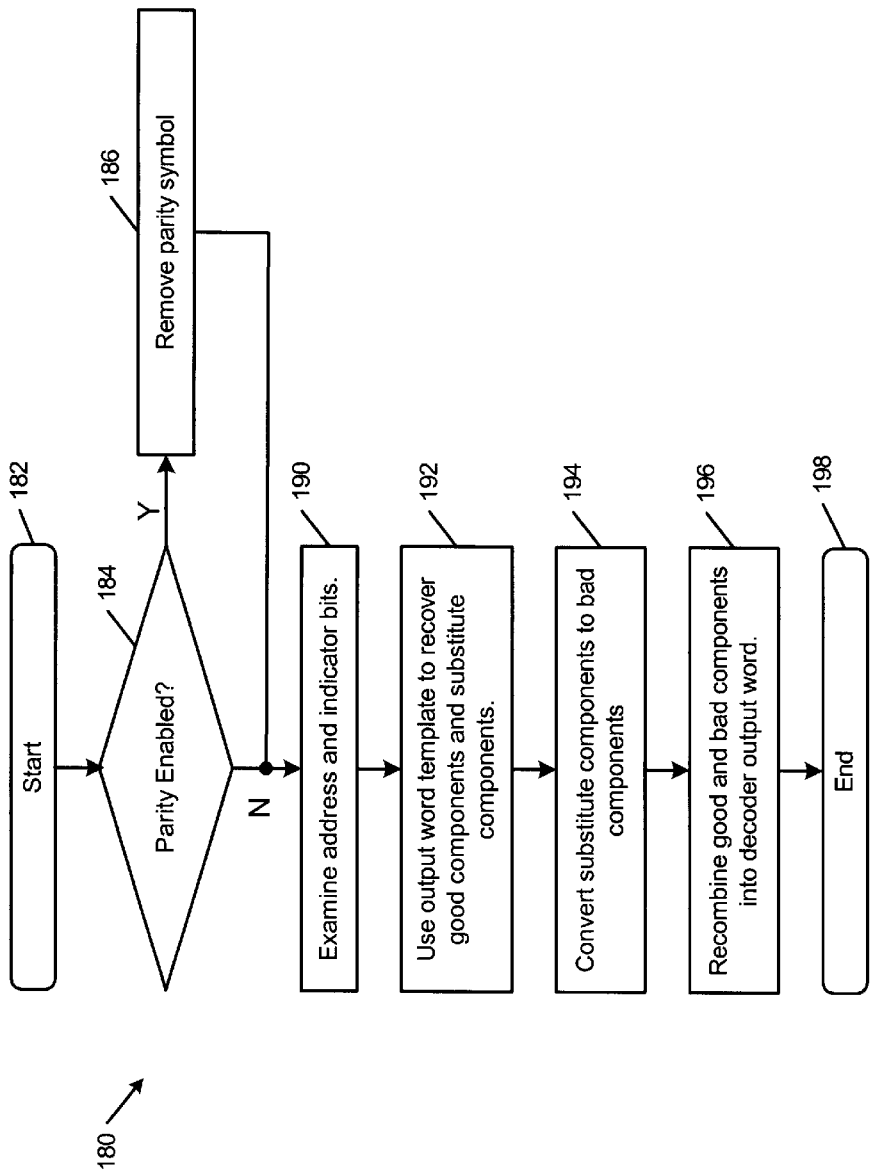
FIG. 10 is a flowchart illustrating steps for decoding that are performed by the decoder of FIG. 3.

Referring now to FIG. 10, steps for decoding are shown generally at 180. Control begins in step 182. In step 184, the decoder determines whether parity is enabled. If it is, control continues with step 186 where the decoder removes the parity symbol(s) from the decoder input word and continues with step 190. If parity is disabled, control continues with step 190 where the address and indicator bits are examined by the decoder. In step 192, the decoder uses the output word template to recover the good and bad components based on the address and indicator bits. In step 194, the decoder converts substitute components to bad components. In step 196, the decoder recombines good and bad components into the decoder output word.

Figure 11:
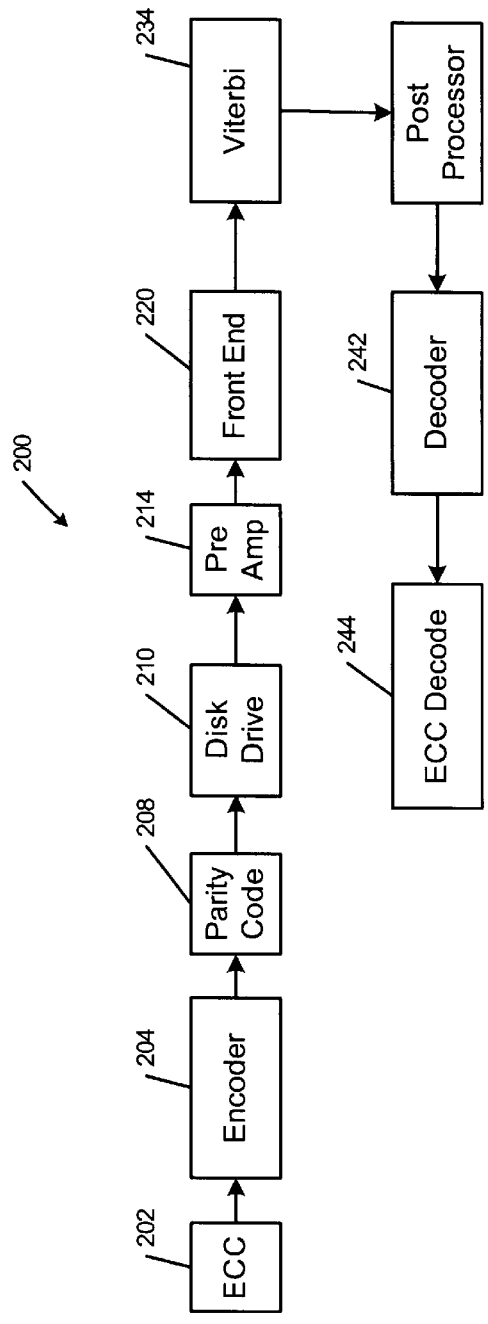
FIG. 11 is a functional block diagram of the encoder of FIG. 2 implemented in an exemplary application for perpendicular recording on magnetic media.
Figure 12:
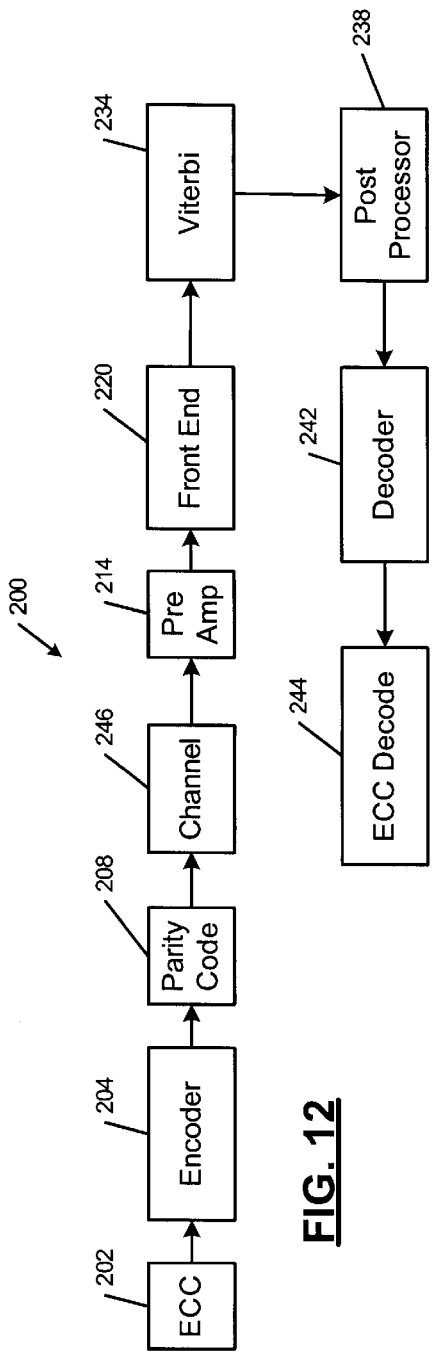
FIG. 12 is a functional block diagram of the encoder of FIG. 2 implemented in an exemplary application including an output channel.

Referring now to FIG. 11, a perpendicular recorder for a magnetic media is shown generally at 200. The perpendicular encoder 200 includes an encoder and decoder according to the present invention. An error correction coding (ECC) circuit 202 is connected to an encoder 204. A parity code circuit 208 is connected to an output of the encoder 204 or is integrated with the encoder 204. Likewise the ECC 202 can be integrated with the encoder 204. Data is written to a disk drive 210. A preamp 214 reads the data from the disk drive 210. A front end 220 is connected to an output of the preamp 214. A Virterbi coder 234 is connected to an output of the front end 220. An output of the Viterbi coder 234 is connected to a post processor 238. A decoder 242 is connected to an output of the post processor 238. An error correction decoding circuit 244 is connected to an output of the decoder 242. Reference numbers from FIG. 11 are used in FIG. 12 to identify similar elements. Skilled artisans will appreciate that the disk drive 210 in FIG. 10 can be replaced by a communications channel 246 connected to an output media such as a wireless local area network, an Ethernet, or any other communications channel.

Figure 13:
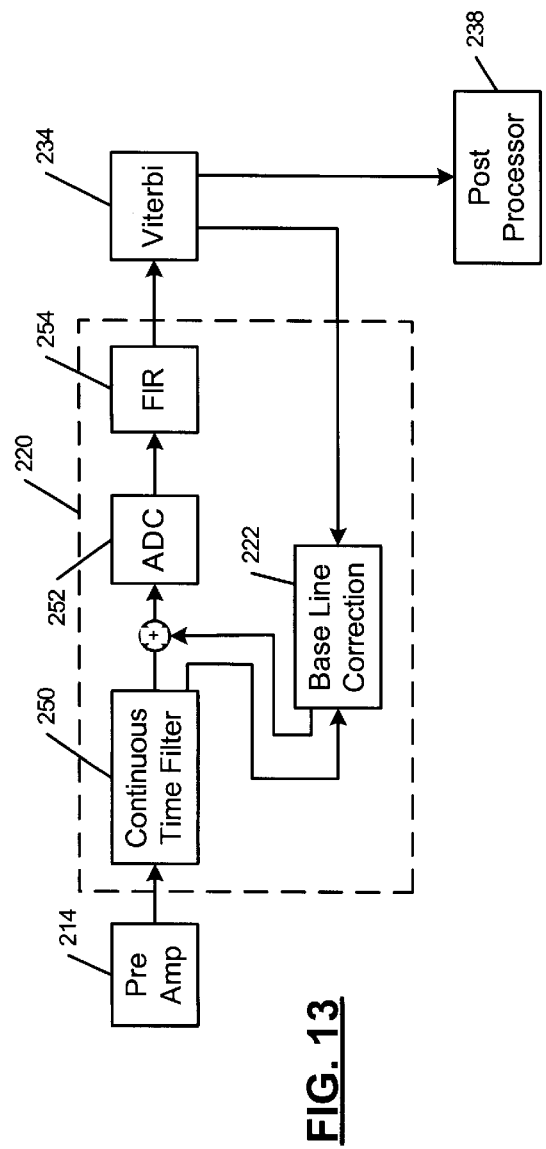
FIG. 13 is a functional block diagram of ah exemplary front end for the encoders of FIGS. 11 and 12.

Referring now to FIG. 13, an exemplary front end 220 is shown in further detail. A continuous time filter 250 is connected to an output of the preamp 214. An output of the continuous time filter 250 is input to a base line correction circuit 252 and to an adder 254. An output of the base line correction circuit 252 is also output to the adder 254. An output of the adder 254 is input to an analog to digital converter (ADC) 256. An output of the ADC 256 is connected to a finite impulse response (FIR) filter 258. An output of the FIR filter 258 is connected to the Viterbi coder 234 with outputs connected to the base line correction circuit 252 and the post processor 238.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A method that constrains a DC level of an input word, comprising:

dividing said input word into a plurality of components, wherein said components include n symbols;

summing said n symbols of said components and generating a sum for each component;

comparing an absolute value of said sum to a threshold;

encoding said component into a substitute component if said absolute value of said sum for said component exceeds said threshold; and combining said components having said sum with said absolute value that does not exceed said threshold with at least one substitute component into an output word.

2. The method of claim 1 wherein said substitute component includes less than n symbols.

3. The method of claim 1 wherein said input word includes 32 symbols and said output word includes at least 33 symbols.

4. The method of claim 3 wherein said components include 8 symbols and wherein said threshold is 4.

5. The method of claim 4 wherein said substitute component includes 5 symbols.

6. The method of claim 1 further comprising selecting an output word template based on a number of substitute components and based on a position that said substitute components originally occupied in said input word.

7. The method of claim 6 further comprising inserting said substitute components in said output word based on said output word template.

8. The method of claim 7 further comprising inserting said components that have said sum with said absolute value that does not exceed said threshold in said output word based on said output word template.

9. The method of claim 8 further comprising inserting address symbols in said output word based on said output word template.

10. The method of claim 9 further comprising inserting indicator symbols in said output word based on said output word template.

11. The method of claim 1 further comprising adding a parity symbol to said output word to make a product of symbols of said output word positive.

12. The method of claim 1 further comprising adding a parity symbol to said output word to make a product of symbols of said output word negative.

13. The method of claim 1 wherein said symbols are in an alphabet $\{1, -1\}$.

14. The method of claim 1 wherein said output word has a sum between −17 and 17.

15. The method of claim 1 further comprising encoding said component into a substitute component if said symbols of said component alternate between a positive value and a negative value over said n symbols.

16. The method of claim 1 further comprising encoding said component into a substitute component if said symbols of said component alternate between a negative value and a positive value over said n symbols.

17. A method that constrains a DC level of an input word for a perpendicular recorder that records symbols on a magnetic media, comprising:
dividing said input word into a plurality of components, wherein said components include n symbols;
summing said n symbols of said components and generating a sum for each component;
comparing an absolute value of said sum to a threshold;
encoding said component into a substitute component having fewer than n symbols if said absolute value of said sum for said component exceeds said threshold;
combining said components having said sum with said absolute value that does not exceed said threshold with at least one substitute component into an output word, wherein said substitute components reduce a digital sum of said symbols of said input word; and
writing said output word using said perpendicular recorder on said magnetic media.

18. The method of claim 17 wherein said input word includes 32 symbols and said output word includes at least 33 symbols.

19. The method of claim 18 wherein said components include 8 symbols and said threshold is equal to 4.

20. The method of claim 19 wherein said substitute component includes 5 symbols.

21. The method of claim 17 further comprising selecting an output word template based on a number of substitute components and based on a position that said substitute components originally occupied in said input word.

22. The method of claim 21 further comprising inserting said substitute components in said output word based on said output word template.

23. The method of claim 22 further comprising inserting said components that have said sum with said absolute value that does not exceed said threshold in said output word based on said output word template.

24. The method of claim 23 further comprising inserting address symbols in said output word based on said output word template.

25. The method of claim 24 further comprising inserting indicator symbols in said output word based on said output word template.

26. The method of claim 17 further comprising adding a parity symbol to said output word to make a product of symbols of said output word positive.

27. The method of claim 17 further comprising adding a parity symbol to said output word to make a product of symbols of said output word negative.

28. The method of claim 17 wherein said output word has a sum between −17 and 17.

29. The method of claim 17 further comprising encoding said component into a substitute component if said symbols of said component alternate between a positive value and a negative value over said n symbols.

30. The method of claim 17 further comprising encoding said component into a substitute component if said symbols of said component alternate between a negative value and a positive value over said n symbols.

31. A DC-level constraining circuit that constrains a DC level of an input word, comprising:
dividing means for dividing said input word into a plurality of components, wherein said components include n symbols;
summing means for summing said n symbols of said components and for generating a sum for each component;
comparing means for comparing an absolute value of said sum to a threshold;
encoding means for encoding said component into a substitute component if said absolute value of said sum for said component exceeds said threshold; and
combining means for combining said components having said sum with said absolute value that does not exceed said threshold with at least one substitute component into an output word.

32. The DC-level constraining circuit of claim 31 wherein said substitute component includes less than n symbols.

33. The DC-level constraining circuit of claim 31 wherein said input word includes 32 symbols and said output word includes at least 33 symbols.

34. The DC-level constraining circuit of claim 33 wherein said components include 8 symbols and wherein said threshold is 4.

35. The DC-level constraining circuit of claim 34 wherein said substitute component includes 5 symbols.

36. The DC-level constraining circuit of claim 31 wherein said encoding means selects an output word template based on a number of substitute components and based on a position that said substitute components originally occupied in said input word.

37. The DC-level constraining circuit of claim 36 wherein said encoding means inserts said substitute components in said output word based on said output word template.

38. The DC-level constraining circuit of claim 37 wherein said encoding means inserts said components that have said sum with said absolute value that does not exceed said threshold in said output word based on said output word template.

39. The DC-level constraining circuit of claim 38 wherein said encoding means inserts address symbols in said output word based on said output word template.

40. The DC-level constraining circuit of claim 39 wherein said encoding means inserts indicator symbols in said output word based on said output word template.

41. The DC-level constraining circuit of claim 31 further comprising parity means for adding a parity symbol to said output word to make a product of symbols of said output word positive.

42. The DC-level constraining circuit of claim 31 further comprising parity means for adding a parity symbol to aid output word to make a product of symbols of said output word negative.

43. The DC-level constraining circuit of claim 31 wherein said symbols are in an alphabet $\{1, -1\}$.

44. The DC-level constraining circuit of claim 31 wherein said output word has a sum between −17 and 17.

45. The DC-level constraining circuit of claim 31 wherein said encoding means encodes said component into a substitute component if said symbols of said component alternate between a positive value and a negative value over said n symbols.

46. The DC-level constraining circuit of claim 31 wherein said encoding means encodes said component into a substitute component if said symbols of said component alternate between a negative value and a positive value over said n symbols.

47. A DC-level constraining circuit that constrains a DC level of an input word for a perpendicular recorder that records symbols on a magnetic media, comprising:
dividing means for dividing said input word into a plurality of components, wherein said components include n symbols;

summing means for summing said n symbols of said components and for generating a sum for each component;

comparing means for comparing an absolute value of said sum to a threshold;

encoding means for encoding said component into a substitute component having fewer than n symbols if said absolute value of said sum for said component exceeds said threshold;

combining means for combining said components having said sum with said absolute value that does not exceed said threshold with at least one substitute component into an output word, wherein said substitute components reduce a digital sum of said symbols of said input word; and writing said output word using said perpendicular recorder on said magnetic media.

48. The DC-level constraining circuit of claim 47 wherein said input word includes 32 symbols and said output word includes at least 33 symbols.

49. The DC-level constraining circuit of claim 48 wherein said components include 8 symbols and said threshold is equal to 4.

50. The DC-level constraining circuit of claim 49 wherein said substitute component includes 5 symbols.

51. The DC-level constraining circuit of claim 47 wherein said encoding means selects an output word template based on a number of substitute components and based on a position that said substitute components originally occupied in said input word.

52. The DC-level constraining circuit of claim 51 wherein said encoding means inserts said substitute components in said output word based on said output word template.

53. The DC-level constraining circuit of claim 52 wherein said encoding means inserts said components that have said sum with said absolute value that does not exceed said threshold in said output word based on said output word template.

54. The DC-level constraining circuit of claim 53 wherein said encoding means inserts address symbols in said output word based on said output word template.

55. The DC-level constraining circuit of claim 54 wherein said encoding means inserts indicator symbols in said output word based on said output word template.

56. The DC-level constraining circuit of claim 47 further comprising parity means for adding a parity symbol to said output word to make a product of symbols of said output word positive.

57. The DC-level constraining circuit of claim 47 further comprising parity means for adding a parity symbol to said output word to make a product of symbols of said output word negative.

58. The DC-level constraining circuit of claim 57 wherein said output word has a sum between −17 and 17.

59. The DC-level constraining circuit of claim 57 wherein said encoding means encodes said component into a substitute component if said symbols of said component alternate between a positive value and a negative value over said n symbols.

60. The DC-level constraining circuit of claim 57 wherein said encoding means encodes said component into a substitute component if said symbols of said component alternate between a negative value and a positive value over said n symbols.

61. A DC-level constraining circuit that constrains a DC level of an input word, comprising:

a divider that divides said input word into a plurality of components, wherein said components include n symbols;

a summer that sums said n symbols of said components and generates a sum for each component;

a comparator that compares an absolute value of said sum to a threshold; and an encoder that encodes said component into a substitute component if said absolute value of said sum for said component exceeds said threshold and combines said components having said sum with said absolute value that does not exceed said threshold with at least one substitute component into an output word.

62. The DC-level constraining circuit of claim 61 wherein said substitute component includes less than n symbols.

63. The DC-level constraining circuit of claim 61 wherein said input word includes 32 symbols and said output word includes at least 33 symbols.

64. The DC-level constraining circuit of claim 63 wherein said components include 8 symbols and wherein said threshold is 4.

65. The DC-level constraining circuit of claim 64 wherein said substitute component includes 5 symbols.

66. The DC-level constraining circuit of claim 61 wherein said encoder selects an output word template based on a number of substitute components and based on a position that said substitute components originally occupied in said input word.

67. The DC-level constraining circuit of claim 66 wherein said encoder inserts said substitute components in said output word based on said output word template.

68. The DC-level constraining circuit of claim 67 wherein said encoder inserts said components that have said sum with said absolute value that does not exceed said threshold in said output word based on said output word template.

69. The DC-level constraining circuit of claim 68 wherein said encoder inserts address symbols in said output word based on said output word template.

70. The DC-level constraining circuit of claim 69 wherein said encoder inserts indicator symbols in said output word based on said output word template.

71. The DC-level constraining circuit of claim 61 further comprising a parity coder that adds a parity symbol to said output word to make a product of symbols of said output word positive.

72. The DC-level constraining circuit of claim 61 further comprising a parity coder that adds a parity symbol to said output word to make a product of symbols of said output word negative.

73. The DC-level constraining circuit of claim 61 wherein said symbols are in an alphabet $\{1, -1\}$.

74. The DC-level constraining circuit of claim 61 wherein said output word has a sum between −17 and 17.

75. The DC-level constraining circuit of claim 61 wherein said encoder encodes said component into a substitute component if said symbols of said component alternate between a positive value and a negative value over said n symbols.

76. The DC-level constraining circuit of claim 61 wherein said encoder encodes said component into a substitute component if said symbols of said component alternate between a negative value and a positive value over said n symbols.

77. A DC-level constraining circuit that constrains a DC level of an input word for a perpendicular recorder that records symbols on a magnetic media, comprising:

a divider that divides said input word into a plurality of components, wherein said components include n symbols;

a summer that sums said n symbols of said components and generates a sum for each component;

a comparator that compares an absolute value of said sum to a threshold;

an encoder that encodes said component into a substitute component having fewer than n symbols if said absolute value of said sum for said component exceeds said threshold and that combines said components having said sum with said absolute value that does not exceed said threshold with at least one substitute component into an output word, wherein said substitute components reduce a digital sum of said symbols of said input word; and a perpendicular recorder that writes said output word on said magnetic media.

78. The DC-level constraining circuit of claim 77 wherein said input word includes 32 symbols and said output word includes at least 33 symbols.

79. The DC-level constraining circuit of claim 78 wherein said components include 8 symbols and said threshold is equal to 4.

80. The DC-level constraining circuit of claim 79 wherein said substitute component includes 5 symbols.

81. The DC-level constraining circuit of claim 77 wherein said encoder selects an output word template based on a number of substitute components and based on a position that said substitute components originally occupied in said input word.

82. The DC-level constraining circuit of claim 81 wherein said encoder inserts said substitute components in said output word based on said output word template.

83. The DC-level constraining circuit of claim 82 wherein said encoder inserts said components that have said sum with said absolute value that does not exceed said threshold in said output word based on said output word template.

84. The DC-level constraining circuit of claim 83 wherein said encoder inserts address symbols in said output word based on said output word template.

85. The DC-level constraining circuit of claim 84 wherein said encoder inserts indicator symbols in said output word based on said output word template.

86. The DC-level constraining circuit of claim 77 further comprising a parity coder that adds a parity symbol to said output word to make a product of symbols of said output word positive.

87. The DC-level constraining circuit of claim 77 further comprising a parity coder that adds a parity symbol to said output word to make a product of symbols of said output word negative.

88. The DC-level constraining circuit of claim 87 wherein said output word has a sum between −17 and 17.

89. The DC-level constraining circuit of claim 87 wherein said encoder encodes said component into a substitute component if said symbols of said component alternate between a positive value and a negative value over said n symbols.

90. The DC-level constraining circuit of claim 87 wherein said encoder encodes said component into a substitute component if said symbols of said component alternate between a negative value and a positive value over said n symbols.

91. A method for decoding an output word of DC-level constraining encoder, comprising:

identifying address and indicator symbols in said output word;

selecting an output word template based on said address and indicator symbols; and using said output word template to identify good components and substitute components in said output word.

92. The method of claim 91 further comprising decoding said substitute components into bad components.

93. The method of claim 92 further comprising combining said good components and said bad components into an input word.

94. The method of claim 91 further comprising removing a parity symbol from said output word.

95. The method of claim 93 wherein said output word has at least one of 33 and 34 symbols and said input word has 32 symbols.

96. A decoding circuit that decodes an output word of a DC-level constraining circuit, comprising:

identifying means for identifying address and indicator symbols in said output word; and decoding means for selecting an output word template based on said address and indicator symbols and for using said output word template to identify good components and substitute components from said output word.

97. The decoding circuit of claim 96 wherein said decoding means decodes said substitute components into bad components.

98. The decoding circuit of claim 97 wherein said decoding means combines said good components and said bad components into an input word.

99. The decoding circuit of claim 96 further comprising parity means for removing a parity symbol from said output word.

100. The decoding circuit of claim 98 wherein said output word has at least one of 33 and 34 symbols and said input word has 32 symbols.

101. A decoding circuit that decodes an output word of DC-level constraining circuit, comprising:

an identifier that identifies address and indicator symbols in said output word; and a decoder that selects an output word template based on said address and indicator symbols and that uses said output word template to extract good components and substitute components from said output word.

102. The decoding circuit of claim 101 wherein said decoder decodes said substitute components into bad components.

103. The decoding circuit of claim 102 wherein said decoder combines said good components and said bad components into an input word.

104. The decoding circuit of claim 101 further comprising a parity coder that removes a parity symbol from said output word.

105. The decoding circuit of claim 103 wherein said output word has at least one of 33 and 34 symbols and said input word has 32 symbols.

106. A DC-level constraining circuit that constrains a DC level of an input word, comprising:

an error correction coding (ECC) circuit;

an encoder that communicates with said ECC circuit, wherein said encoder divides said input word into a plurality of components each having n symbols, sums said n symbols of said components and generates a sum for each component, compares an absolute value of said sum to a threshold, encodes said component into a substitute component if said absolute value of said sum for said component exceeds said threshold, and combines said components having said sum with said absolute value that does not exceed said threshold with at least one substitute component into an output word; and a disk drive that communicates with said encoder and that writes said output word onto a magnetic media.

107. The DC-level constraining circuit of claim 106 wherein said substitute component includes less than n symbols.

108. The DC-level constraining circuit of claim 106 wherein said input word includes 32 symbols and said output word includes at least 33 symbols.

109. The DC-level constraining circuit of claim 108 wherein said components include 8 symbols and wherein said threshold is 4.

110. The DC-level constraining circuit of claim 109 wherein said substitute component includes 5 symbols.

111. The DC-level constraining circuit of claim 106 wherein said encoder selects an output word template based on a number of substitute components and based on a position that said substitute components originally occupied in said input word.

112. The DC-level constraining circuit of claim 111 wherein said encoder inserts said substitute components in said output word based on said output word template.

113. The DC-level constraining circuit of claim 112 wherein said encoder inserts said components that have said sum with said absolute value that does not exceed said threshold in said output word based on said output word template.

114. The DC-level constraining circuit of claim 113 wherein said encoder inserts address symbols in said output word based on said output word template.

115. The DC-level constraining circuit of claim 114 wherein said encoder inserts indicator symbols in said output word based on said output word template.

116. The DC-level constraining circuit of claim 106 further comprising a parity coder that adds a parity symbol to said output word to make a product of symbols of said output word positive.

117. The DC-level constraining circuit of claim 106 further comprising a parity coder that adds a parity symbol to said output word to make a product of symbols of said output word negative.

118. The DC-level constraining circuit of claim 106 wherein said symbols are in an alphabet {1, −1}.

119. The DC-level constraining circuit of claim 106 wherein said output word has a sum between −17 and 17.

120. The DC-level constraining circuit of claim 106 wherein said encoder encodes said component into a substitute component if said symbols of said component alternate between a positive value and a negative value over said n symbols.

121. The DC-level constraining circuit of claim 106 wherein said encoder encodes said component into a substitute component if said symbols of said component alternate between a negative value and a positive value over said n symbols.

122. The DC-level constraining circuit of claim 106 wherein said disk drive is a perpendicular recorder.

123. A DC-level constraining circuit that constrains a DC level of an input word, comprising:
  error means for providing error correction coding;
  encoding means that communicates with said error means for dividing said input word into a plurality of components each having n symbols, for summing said n symbols of said components, for generating a sum for each component, for comparing an absolute value of said sum to a threshold, for encoding said component into a substitute component if said absolute value of said sum for said component exceeds said threshold, and for combining said components having said sum with said absolute value that does not exceed said threshold with at least one substitute component into an output word; and
  drive means that communicates with said encoding means for writing said output word onto a magnetic media.

124. The DC-level constraining circuit of claim 123 wherein said substitute component includes less than n symbols.

125. The DC-level constraining circuit of claim 123 wherein said input word includes 32 symbols and said output word includes at least 33 symbols.

126. The DC-level constraining circuit of claim 125 wherein said components include 8 symbols and wherein said threshold is 4.

127. The DC-level constraining circuit of claim 126 wherein said substitute component includes 5 symbols.

128. The DC-level constraining circuit of claim 123 wherein said encoding means selects an output word template based on a number of substitute components and based on a position that said substitute components originally occupied in said input word.

129. The DC-level constraining circuit of claim 128 wherein said encoding means inserts said substitute components in said output word based on said output word template.

130. The DC-level constraining circuit of claim 129 wherein said encoding means inserts said components that have said sum with said absolute value that does not exceed said threshold in said output word based on said output word template.

131. The DC-level constraining circuit of claim 130 wherein said encoding means inserts address symbols in said output word based on said output word template.

132. The DC-level constraining circuit of claim 131 wherein said encoding means inserts indicator symbols in said output word based on said output word template.

133. The DC-level constraining circuit of claim 123 further comprising parity means for adding a parity symbol to said output word to make a product of symbols of said output word positive.

134. The DC-level constraining circuit of claim 123 further comprising parity means for adding a parity symbol to said output word to make a product of symbols of said output word negative.

135. The DC-level constraining circuit of claim 123 wherein said symbols are in an alphabet {1, −1}.

136. The DC-level constraining circuit of claim 123 wherein said output word has a sum between −17 and 17.

137. The DC-level constraining circuit of claim 123 wherein said encoding means encodes said component into a substitute component if said symbols of said component alternate between a positive value and a negative value over said n symbols.

138. The DC-level constraining circuit of claim 123 wherein said encoding means encodes said component into a substitute component if said symbols of said component alternate between a negative value and a positive value over said n symbols.

139. The DC-level constraining circuit of claim 123 wherein said drive means is a perpendicular recorder.

140. A method for constraining a DC level of an input word, comprising:
  error correction coding an input word;
  dividing said input word into a plurality of components each having n symbols;
  summing said n symbols of said components and generating a sum for each component;

comparing an absolute value of said sum to a threshold;

encoding said component into a substitute component if said absolute value of said sum for said component exceeds said threshold;

combining said components having said sum with said absolute value that does not exceed said threshold with at least one substitute component into an output word; and writing said output word onto a magnetic media.

141. The method of claim 140 wherein said substitute component includes less than n symbols.

142. The method of claim 140 wherein said input word includes 32 symbols and said output word includes at least 33 symbols.

143. The method of claim 142 wherein said components include 8 symbols and wherein said threshold is 4.

144. The method of claim 143 wherein said substitute component includes 5 symbols.

145. The method of claim 140 further comprising selecting an output word template based on a number of substitute components and based on a position that said substitute components originally occupied in said input word.

146. The method of claim 145 further comprising inserting said substitute components in said output word template based on said output word template.

147. The method of claim 146 further comprising inserting said components that have said sum with said absolute value that does not exceed said threshold in said output word based on said output word template.

148. The method of claim 147 further comprising inserting address symbols in said output word based on said output word template.

149. The method of claim 148 further comprising inserting indicator symbols in said output word based on said output word template.

150. The method of claim 140 further comprising adding a parity symbol to said output word to make a product of symbols of said output word positive.

151. The method of claim 140 further comprising adding a parity symbol to said output word to make a product of symbols of said output word negative.

152. The method of claim 140 wherein said symbols are in an alphabet {1, −1}.

153. The method of claim 140 wherein said output word has a sum between −17 and 17.

154. The method of claim 140 further comprising encoding said component into a substitute component if said symbols of said component alternate between a positive value and a negative value over said n symbols.

155. The method of claim 140 further comprising encoding said component into a substitute component if said symbols of said component alternate between a negative value and a positive value over said n symbols.

156. The method of claim 140 wherein said disk drive is a perpendicular recorder.

157. A DC-level constraining circuit that constrains a DC level of an input word, comprising:

an error correction coding (ECC) circuit;

an encoder that communicates with said ECC circuit, wherein said encoder divides said input word into a plurality of components each having n symbols, sums said n symbols of said components and generates a sum for each component, compares an absolute value of said sum to a threshold, encodes said component into a substitute component if said absolute value of said sum for said component exceeds said threshold, and combines said components having said sum with said absolute value that does not exceed said threshold with at least one substitute component into an output word; and an output channel in communication with said encoder.

158. The DC-level constraining circuit of claim 157 wherein said output channel is one of an Ethernet, a wireless local area network, and a disk drive.

159. The DC-level constraining circuit of claim 157 wherein said substitute component includes less than n symbols.

160. The DC-level constraining circuit of claim 157 wherein said input word includes 32 symbols and said output word includes at least 33 symbols.

161. The DC-level constraining circuit of claim 160 wherein said substitute component includes 5 symbols.

162. The DC-level constraining circuit of claim 157 wherein said encoder selects an output word template based on a number of substitute components and based on a position that said substitute components originally occupied in said input word.

163. The DC-level constraining circuit of claim 162 wherein said encoder inserts said substitute components in said output word based on said output word template.

164. The DC-level constraining circuit of claim 163 wherein said encoder inserts said components that have said sum with said absolute value that does not exceed said threshold in said output word based on said output word template.

165. The DC-level constraining circuit of claim 164 wherein said encoder inserts address symbols in said output word based on said output word template.

166. The DC-level constraining circuit of claim 165 wherein said encoder inserts indicator symbols in said output word based on said output word template.

167. The DC-level constraining circuit of claim 157 further comprising a parity coder that adds a parity symbol to said output word to make a product of symbols of said output word positive.

168. The DC-level constraining circuit of claim 157 further comprising a parity coder that adds a parity symbol to said output word to make a product of symbols of said output word negative.

169. The DC-level constraining circuit of claim 157 wherein said symbols are in an alphabet {1, −1}.

170. The DC-level constraining circuit of claim 157 wherein said output word has a sum between −17 and 17.

171. The DC-level constraining circuit of claim 157 wherein said encoder encodes said component into a substitute component if said symbols of said component alternate between a positive value and a negative value over said n symbols.

172. The DC-level constraining circuit of claim 157 wherein said encoder encodes said component into a substitute component if said symbols of said component alternate between a negative value and a positive value over said n symbols.

173. The DC-level constraining circuit of claim 160 wherein said components include 8 symbols and wherein said threshold is 4.

174. A DC-level constraining circuit that constrains a DC level of an input word, comprising:

error means for providing error correction coding;

encoding means that communicates with said error means for dividing said input word into a plurality of components each having n symbols, for summing said n symbols of said components, for generating a sum for each component, for comparing an absolute value of said sum to a threshold, for encoding said component into a substitute component if said absolute value of said sum for said component exceeds said threshold, and for combining said components having said sum with said absolute value that does not exceed said threshold with at least one substitute component into an output word; and an output channel in communication with said encoder.

175. The DC-level constraining circuit of claim 174 wherein said output channel is one of an Ethernet, a wireless local area network, and a disk drive.

176. The DC-level constraining circuit of claim 174 wherein said substitute component includes less than n symbols.

177. The DC-level constraining circuit of claim 174 wherein said input word includes 32 symbols and said output word includes at least 33 symbols.

178. The DC-level constraining circuit of claim 177 wherein said substitute component includes 5 symbols.

179. The DC-level constraining circuit of claim 174 wherein said encoding means selects an output word template based on a number of substitute components and based on a position that said substitute components originally occupied in said input word.

180. The DC-level constraining circuit of claim 179 wherein said encoding means inserts said substitute components in said output word based on said output word template.

181. The DC-level constraining circuit of claim 180 wherein said encoding means inserts said components that have said sum with said absolute value that does not exceed said threshold in said output word based on said output word template.

182. The DC-level constraining circuit of claim 181 wherein said encoding means inserts address symbols in said output word based on said output word template.

183. The DC-level constraining circuit of claim 182 wherein said encoding means inserts indicator symbols in said output word based on said output word template.

184. The DC-level constraining circuit of claim 174 further comprising parity means for adding a parity symbol to said output word to make a product of symbols of said output word positive.

185. The DC-level constraining circuit of claim 174 further comprising parity means for adding a parity symbol to said output word to make a product of symbols of said output word negative.

186. The DC-level constraining circuit of claim 174 wherein said symbols are in an alphabet $\{1, -1\}$.

187. The DC-level constraining circuit of claim 174 wherein said output word has a sum between −17 and 17.

188. The DC-level constraining circuit of claim 174 wherein said encoding means encodes said component into a substitute component if said symbols of said component alternate between a positive value and a negative value over said n symbols.

189. The DC-level constraining circuit of claim 174 wherein said encoding means encodes said component into a substitute component if said symbols of said component alternate between a negative value and a positive value over said n symbols.

190. The DC-level constraining circuit of claim 177 wherein said components include 8 symbols and wherein said threshold is 4.

191. A method for constraining a DC level of an input word, comprising:

error correction coding an input word;

dividing said input word into a plurality of components each having n symbols;

summing said n symbols of said components and generating a sum for each component;

comparing an absolute value of said sum to a threshold;

encoding said component into a substitute component if said absolute value of said sum for said component exceeds said threshold;

combining said components having said sum with said absolute value that does not exceed said threshold with at least one substitute component into an output word; and transmitting said output word on an output channel.

192. The method of claim 191 wherein said output channel is one of an Ethernet, a wireless local area network, and a disk drive.

193. The method of claim 191 wherein said substitute component includes less than n symbols.

194. The method of claim 191 wherein said input word includes 32 symbols and said output word includes at least 33 symbols.

195. The method of claim 194 wherein said substitute component includes 5 symbols.

196. The method of claim 191 further comprising selecting an output word template based on a number of substitute components and based on a position that said substitute components originally occupied in said input word.

197. The method of claim 196 further comprising inserting said substitute components in said output word based on said output word template.

198. The method of claim 197 further comprising inserting said components that have said sum with said absolute value that does not exceed said threshold in said output word based on said output word template.

199. The method of claim 198 further comprising inserting address symbols in said output word based on said output word template.

200. The method of claim 199 further comprising inserting indicator symbols in said output word based on said output word template.

201. The method of claim 191 further comprising adding a parity symbol to said output word to make a product of symbols of said output word positive.

202. The method of claim 191 further comprising adding a parity symbol to said output word to make a product of symbols of said output word negative.

203. The method of claim 191 wherein said symbols are in an alphabet $\{1, -1\}$.

204. The method of claim 191 wherein said output word has a sum between −17 and 17.

205. The method of claim 191 further comprising encoding said component into a substitute component if said symbols of said component alternate between a positive value and a negative value over said n symbols.

206. The method of claim 191 further comprising encoding said component into a substitute component if said symbols of said component alternate between a negative value and a positive value over said n symbols.

207. The method of claim 194 wherein said components include 8 symbols and wherein said threshold is 4.

208. A decoding circuit for an encoded input word, comprising:

a preamplifier that communicates with a channel that carries an encoded output word;

a front end that communicates with said preamplifier;

a Viterbi coder that communicates with said front end;

a post processor that communicates with said Viterbi coder; and a decoder that identifies address and indicator symbols in said output word, that selects an output word template based on said address and indicator symbols, and that uses said output word template to identify good components and substitute components in said encoded output word.

209. The decoding circuit of claim 208 wherein said channel is one of an Ethernet, a wireless local area network and a disk drive.

210. The decoding circuit of claim 208 wherein said decoder decodes said substitute components into bad components.

211. The decoding circuit of claim 210 wherein said decoder recombines said good components and said bad components into an input word.

212. The decoding circuit of claim 208 further comprising a parity circuit that removes a parity symbol from said output word.

213. The decoding circuit of claim 211 wherein said encoded output word has at least one of 33 symbols and said decoded input word has 32 symbols.

214. A decoding circuit for an encoded input word, comprising:

amplifying means that communicates with a channel that carries an encoded output word for amplifying said encoded output word;

front end means that communicates with said amplifying means and that processes said amplified and encoded output word;

coding means that communicates with said front end means for applying Viterbi coding;

processing means that communicates with said coding means for providing post processing; and decoding means that communicates with said post processing means for identifying address and indicator symbols in said output word, for selecting an output word template based on said address and indicator symbols, and for using said output word template to identify good components and substitute components in said encoded output word.

215. The decoding circuit of claim 214 wherein said channel is one of an Ethernet, a wireless local area network and a disk drive.

216. The decoding circuit of claim 214 wherein said decoding means decodes said substitute components into bad components.

217. The decoding circuit of claim 216 wherein said decoding means recombines said good components and said bad components into an input word.

218. The decoding circuit of claim 214 further comprising parity means for removing a parity symbol from said output word.

219. The decoding circuit of claim 217 wherein said encoded output word has at least one of 33 symbols and said decoded input word has 32 symbols.

220. A method for decoding an encoded input word, comprising:

communicating with a channel that carries an encoded output word;

amplifying said encoded output word;

processing said amplified and encoded output word using a front end;

coding said amplified and encoded output word using Viterbi coding;

performing post processing;

identifying address and indicator symbols in said output word;

selecting an output word template based on said address and indicator symbols; and using said output word template to identify good components and substitute components in said encoded output word.

221. The method of claim 220 wherein said channel is one of an Ethernet, a wireless local area network and a disk drive.

222. The method of claim 220 further comprising decoding said substitute components into bad components.

223. The method of claim 222 further comprising recombining said good components and said bad components into an input word.

224. The method of claim 220 further comprising removing a parity symbol from said output word.

225. The method of claim 223 wherein said encoded output word has at least one of 33 symbols and said input word has 32 symbols.

226. A software method that constrains a DC level of an input word, comprising:

dividing said input word into a plurality of components, wherein said components include n symbols;

summing said n symbols of said components and generating a sum for each component;

comparing an absolute value of said sum to a threshold;

encoding said component into a substitute component if said absolute value of said sum for said component exceeds said threshold; and combining said components having said sum with said absolute value that does not exceed said threshold with at least one substitute component into an output word.

227. The software method of claim 226 wherein said substitute component includes less than n symbols.

228. The software method of claim 226 wherein said input word includes 32 symbols and said output word includes at least 33 symbols and wherein said components include 8 symbols and wherein said threshold is 4.

229. The software method of claim 226 further comprising writing said output word to an output media, wherein said output media is one of an Ethernet, a wireless local area network, and a disk drive.

230. The software method of claim 229 wherein said substitute component includes 5 symbols.

231. The software method of claim 226 further comprising selecting an output word template based on a number of substitute components and based on a position that said substitute components originally occupied in said input word.

232. The software method of claim 231 further comprising inserting said substitute components in said output word based on said output word template.

233. The software method of claim 232 further comprising inserting said components that have said sum with said absolute value that does not exceed said threshold in said output word based on said output word template.

234. The software method of claim 233 further comprising inserting address symbols in said output word based on said output word template.

235. The software method of claim 234 further comprising inserting indicator symbols in said output word based on said output word template.

236. The software method of claim 226 further comprising adding a parity symbol to said output word to make a product of symbols of said output word positive.

237. The software method of claim 226 further comprising adding a parity symbol to said output word to make a product of symbols of said output word negative.

238. The software method of claim 226 wherein said symbols are in an alphabet $\{1, -1\}$.

239. The software method of claim 226 wherein said output word has a sum between −17 and 17.

240. The software method of claim 226 further comprising encoding said component into a substitute component if said symbols of said component alternate between a positive value and a negative value over said n symbols.

241. The software method of claim 226 further comprising encoding said component into a substitute component if said symbols of said component alternate between a negative value and a positive value over said n symbols.

242. A software method that constrains a DC level of an input word for a perpendicular recorder that records symbols on a magnetic media, comprising:

dividing said input word into a plurality of components, wherein said components include n symbols;

summing said n symbols of said components and generating a sum for each component;

comparing an absolute value of said sum to a threshold;

encoding said component into a substitute component having fewer than n symbols if said absolute value of said sum for said component exceeds said threshold;

combining said components having said sum with said absolute value that does not exceed said threshold with at least one substitute component into an output word, wherein said substitute components reduce a digital sum of said symbols of said input word; and writing said output word to an output media.

243. The software method of claim 242 wherein said input word includes 32 symbols and said output word includes at least 33 symbols and wherein said components include 8 symbols and said threshold is equal to 4.

244. The software method of claim 242 wherein said output media is one of an Ethernet, a wireless local area network, and a disk drive.

245. The software method of claim 243 wherein said substitute component includes 5 symbols.

246. The software method of claim 242 further comprising selecting an output word template based on a number of substitute components and based on a position that said substitute components originally occupied in said input word.

247. The software method of claim 246 further comprising inserting said substitute components in said output word based on said output word template.

248. The software method of claim 247 further comprising inserting said components that have said sum with said absolute value that does not exceed said threshold in said output word based on said output word template.

249. The software method of claim 248 further comprising inserting address symbols in said output word based on said output word template.

250. The software method of claim 249 further comprising inserting indicator symbols in said output word based on said output word template.

251. The software method of claim 242 further comprising adding a parity symbol to said output word to make a product of symbols of said output word positive.

252. The software method of claim 242 further comprising adding a parity symbol to said output word to make a product of symbols of said output word negative.

253. The software method of claim 242 wherein said output word has a sum between −17 and 17.

254. The software method of claim 242 further comprising encoding said component into a substitute component if said symbols of said component alternate between a positive value and a negative value over said n symbols.

255. The software method of claim 242 further comprising encoding said component into a substitute component if said symbols of said component alternate between a negative value and a positive value over said n symbols.

* * * * *

UNITED STATES PATENT AND TRADEMARK OFFICE
CERTIFICATE OF CORRECTION

PATENT NO. : 6,661,356 B1
APPLICATION NO. : 10/053885
DATED : December 9, 2003
INVENTOR(S) : Mats Oberg It is certified that error appears in the above-identified patent and that said Letters Patent is hereby corrected as shown below:

Column 2, Line 60    Delete "ah" and insert -- an --
Column 8, Line 45    Delete "aid" and insert -- said --

Signed and Sealed this

Fourth Day of September, 2007

JON W. DUDAS
*Director of the United States Patent and Trademark Office*